United States Patent
Jiang et al.

(10) Patent No.: US 11,655,540 B2
(45) Date of Patent: May 23, 2023

(54) METHODS AND APPARATUS FOR ADJUSTING WAFER PERFORMANCE USING MULTIPLE RF GENERATORS

(71) Applicant: APPLIED MATERIALS, INC., Santa Clara, CA (US)

(72) Inventors: Chong Jiang, Cupertino, CA (US); Malcolm Delaney, Los Gatos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 162 days.

(21) Appl. No.: 16/912,887

(22) Filed: Jun. 26, 2020

(65) Prior Publication Data

US 2021/0404065 A1 Dec. 30, 2021

(51) Int. Cl.
*C23C 16/52* (2006.01)
*C23C 16/455* (2006.01)
*C23C 16/505* (2006.01)

(52) U.S. Cl.
CPC ........ *C23C 16/52* (2013.01); *C23C 16/45536* (2013.01); *C23C 16/505* (2013.01)

(58) Field of Classification Search
CPC .......... H01J 37/32174; H01J 37/32165; C23C 16/505; C23C 16/45536; C23C 16/52
See application file for complete search history.

(56) References Cited

U.S. PATENT DOCUMENTS

| 7,402,821 | B2 | 7/2008 | Bernhardt |
| 9,378,930 | B2 | 6/2016 | Grimbergen et al. |
| 2001/0017524 | A1 | 8/2001 | Ishii |
| 2001/0037770 | A1 | 11/2001 | Otsubo |
| 2005/0255255 | A1* | 11/2005 | Kawamura ....... H01J 37/32082 118/723 E |
| 2009/0202741 | A1 | 8/2009 | Stimson et al. |
| 2010/0276391 | A1* | 11/2010 | Grimbergen ...... H01J 37/32174 216/41 |
| 2011/0240222 | A1* | 10/2011 | Sawada ................. H01J 37/321 156/345.28 |

(Continued)

OTHER PUBLICATIONS

C. Tröster, Time Synchronous Signals with Multiple R&S®SMBV100A Vector Signal Generators Application Note, Rohde & Schwarz Time Synchronous Signals with Multiple R&S®SMBV100A Vector Signal Generators 2, 01.2012-1GP84_0E, 43 pages.

(Continued)

*Primary Examiner* — Joseph A Miller, Jr.
(74) *Attorney, Agent, or Firm* — Moser Taboada

(57) ABSTRACT

Methods and apparatus for controlling a semiconductor process leverage phase shifting between at least two RF generators to improve wafer performance parameters. In some embodiments, an apparatus may include a first radio frequency (RF) generator, a second RF frequency generator, a cable connected between the first RF generator and the second RF generator wherein the cable is configured to synchronize the first RF generator and the second RF generator, and an adjustable phase shift assembly with a two-dimensional trace and an adjustable contact point. The adjustable phase shift assembly is connected to the cable and configured to alter at least one wafer performance parameter by changing a phase shift relationship between the first RF frequency generator and the second RF frequency generator.

17 Claims, 6 Drawing Sheets

(56) References Cited

U.S. PATENT DOCUMENTS

| | | | | |
|---|---|---|---|---|
| 2014/0152400 A1* | 6/2014 | Rogers | ............... | H01G 5/16 |
| | | | | 333/156 |
| 2015/0136325 A1 | 5/2015 | Ye et al. | | |
| 2015/0303581 A1* | 10/2015 | Bodo | ............... | G01S 13/426 |
| | | | | 342/7 |
| 2017/0004955 A1* | 1/2017 | Leeser | ............... | G01R 19/0061 |
| 2019/0288737 A1 | 9/2019 | Hanks et al. | | |

OTHER PUBLICATIONS

C. Tröster-Schmid, T. Bednorz, Generating Multiple Phase Coherent Signals—Aligned in Phase and Time Application Note, http://www.rohde-schwarz.com/aponote/1GP108. 09.2016-1GP108_1E, Rohde & Schwarz Generating Multiple Phase Coherent Signals—Aligned in Phase and Time, 73 pages.

International Search Report for PCT/US2021/038806, dated Oct. 14, 2021.

\* cited by examiner

METHODS AND APPARATUS FOR ADJUSTING WAFER PERFORMANCE USING MULTIPLE RF GENERATORS

FIELD

Embodiments of the present principles generally relate to semiconductor chambers used in semiconductor processes.

BACKGROUND

Many semiconductor processes employ multiple radio frequency (RF) generators during processing of substrates. In some configurations, twin chambers use separate RF generators but with a common power supply and synchronized signals. In some configurations, twin chambers use separate RF generators with separate power supplies but still use synchronized signals. And in other configurations, an RF generator maybe used for plasma generation and another RF generator maybe used on the same chamber for biasing the substrate. The inventors have observed that in both configurations the RF generators interact with each other causing unwanted variations during the processing of the substrates. Etching rates and deposition rates and uniformity are be influenced by the use of multiple RF generators.

Thus, the inventors have provided improved methods and apparatus for processing substrates by eliminating or reducing the multiple RF generator effects.

SUMMARY

Methods and apparatus for adjusting a phase shift between multiple RF generators are provided herein.

In some embodiments, an apparatus for controlling a semiconductor process may comprise a first radio frequency (RF) generator, a second RF frequency generator, a cable connected between the first RF frequency generator and the second RF frequency generator wherein the cable is configured to synchronize the first RF frequency generator and the second RF frequency generator, and an adjustable phase shift assembly with a two-dimensional trace and an adjustable contact point wherein the adjustable phase shift assembly is connected to the cable and configured to alter at least one wafer performance parameter by changing a phase shift relationship between the first RF frequency generator and the second RF frequency generator.

In some embodiments, the apparatus may further include wherein the first RF frequency generator is connected to a first process chamber and the second RF frequency generator is connected to a second process chamber and wherein the adjustable phase shift assembly is configured to approximately match the at least one wafer performance parameter in the first process chamber to the second process chamber, wherein the first RF frequency generator supplies RF plasma power in a process chamber and the second RF frequency generator supplies RF bias power in the process chamber and wherein the adjustable phase shift assembly is configured to allow a first frequency of the first RF frequency generator and a second frequency of the second RF frequency generator to be approximately equal, at least one metrology sensor configured to receive and transmit metrology data related to a substrate process, and a controller connected to the at least one metrology sensor and the adjustable phase shift assembly, the controller configured to receive the metrology data from the at least one metrology sensor and change the phase shift relationship between the first RF frequency generator and the second RF frequency generator in response to the metrology data by automatically changing a length of the cable with the adjustable phase shift assembly, wherein the adjustable phase shift assembly is located within the first RF frequency generator, wherein the adjustable phase shift assembly is located in the cable between the first RF frequency generator and the second RF frequency generator, wherein the two-dimensional trace is a recursive trace, wherein the adjustable contact point moves linearly across the recursive trace, wherein a first end of the two-dimensional trace is connected within the first RF frequency generator and a second end of the two-dimensional trace is connected to the cable, wherein the adjustable phase shift assembly includes a glass plate with the two-dimensional trace being conductive ink, and/or wherein the adjustable phase shift assembly includes a substrate base material with the two-dimensional trace being a copper trace.

In some embodiments, an apparatus for controlling a semiconductor process may comprise a first radio frequency (RF) generator, a second RF frequency generator, and an adjustable phase shift assembly with a two-dimensional trace with a first end connected to the first RF frequency generator and an adjustable contact point at a second end connected to the second RF frequency generator wherein the adjustable phase shift assembly is configured to alter at least one wafer performance parameter by changing a phase shift between the first RF frequency generator and the second RF frequency generator by moving the adjustable contact point on the two-dimensional trace.

In some embodiments, the apparatus may further include wherein the first RF frequency generator is connected to a first process chamber and the second RF frequency generator is connected to a second process chamber and wherein the adjustable phase shift assembly is configured to approximately match the at least one wafer performance parameter in the first process chamber to the second process chamber, wherein the first RF frequency generator supplies RF plasma power in a process chamber and the second RF frequency generator supplies RF bias power in the process chamber and wherein the adjustable phase shift assembly is configured to allow a first frequency of the first RF frequency generator and a second frequency of the second RF frequency generator to be approximately equal, at least one metrology sensor configured to receive and transmit metrology data related to a substrate process, and a controller connected to the at least one metrology sensor and the adjustable phase shift assembly wherein the controller is configured to receive the metrology data from the at least one metrology sensor and change the phase shift between the first RF frequency generator and the second RF frequency generator in response to the metrology data by automatically moving the adjustable contact point on the two-dimensional trace, wherein the two-dimensional trace is a recursive trace, wherein the adjustable phase shift assembly includes a glass plate with the two-dimensional trace being conductive ink, and/or wherein the adjustable phase shift assembly includes a substrate base material with the two-dimensional trace being a copper trace.

In some embodiments, a method of controlling a semiconductor process may comprise connecting a first radio frequency (RF) generator to a second RF frequency generator via an adjustable phase shift assembly having a two-dimensional trace with a first end connected to the first RF frequency generator and an adjustable contact point at a second end connected to the second RF frequency generator and altering at least one wafer performance parameter by adjusting a phase shift between the first RF frequency generator and the second RF frequency generator by moving the adjustable contact point on the two-dimensional trace to increase or decrease a connection length between the first RF frequency generator and the second RF frequency generator.

In some embodiments, the method may further include receiving metrology data from at least one sensor related to a substrate process and adjusting the phase shift between the first RF frequency generator and the second RF frequency generator by automatically moving the adjustable contact point on the two-dimensional trace, the phase shift adjusted to improve the metrology data.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
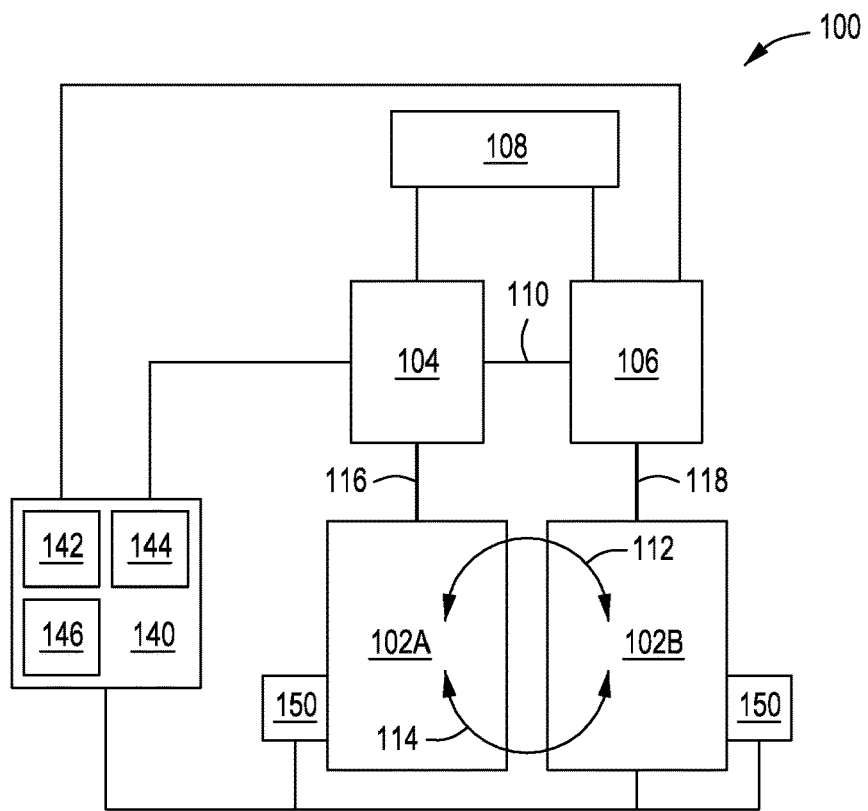
FIG. 1 depicts a schematic view of twin process chambers in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide phase shifting adjustability between RF generators to compensate for deficiencies in substrate processing caused by interaction of the RF generators. Uniformity and throughput performance may be substantially increased by controlling the phase difference between the RF generators. Adjusting the phase shift helps to compensate for capacitive and inductive interactions between the RF generators. Advantageously, some embodiments provide phase shift adjustment by controlling the length of the synchronization cable between the RF generators. Noise and other detrimental effects are eliminated or reduced by using a two-dimensional trace instead of a three-dimensional cable to adjust the cable length. Metrology data from processed substrates may also be used as feedback to a controller to enable automatic phase shift adjustments based upon results of the current processing.

Twin-chamber designs are commonly used in the semiconductor industry to improve the throughput and control costs. The twin-chamber in principle should have sides that are independent of each other in terms of the RF signals. However, each side of the twin-chamber will always have coupling, although the coupling may be very weak. Because of the coupling, the RF signals impact each side of the twin-chamber, and, as a result, the deposition rate and/or etch rate will not match on both sides of the chamber. The weak coupling is not a constant and depends on process conditions such as, but not limited to, chamber pressure, wafer to RF source spacing, and/or hardware design in general. To make the twin-chamber deposition rate or etch rate match in each side, a method to compensate for the weak coupling is needed. The methods and apparatus of the present principles provide a simple and robust solution for the coupling compensation through RF phase shifting control between the two sides of the twin chamber. The phase shift relationship between the RF frequency generators may be adjusted from greater than zero degrees to less than 360 degrees to fully compensate for the coupling effects.

FIG. 1 depicts a schematic view 100 of a first chamber 102A and a second chamber 102B of a twin process chamber in accordance with some embodiments. Twin process chambers may be used to increase throughput of a particular process. The first chamber 102A is connected via a first connection 116 to a first RF frequency generator 104 which is powered by an RF power supply 108. The second chamber 102B is connected via a second connection 118 to a second RF frequency generator 106 that is also connected to the RF power supply 108. To keep the first RF frequency generator 104 and the second RF frequency generator 106 synchronized, a synchronization cable may be connected between the first RF frequency generator 104 and the second RF frequency generator 106. When multiple RF frequency generators are used, one of the RF frequency generators is typically used as a master while the others are slaves to the master. The master's signal function generator is then used to generate a reference RF frequency signal that is sent to the slaved generators over the synchronization cable. In general, the RF frequencies are in phase. The inventors have discovered, however, that being in phase may increase the negative coupling effects in the processing between the chambers.

A controller 140 controls the operation of one or more chambers using a direct control or alternatively, by controlling the computers (or controllers) associated with the process chamber(s). In operation, the controller 140 enables data collection and feedback from the respective chambers and systems to optimize performance, such as data from one or more metrology sensors 150. The controller 140 generally includes a Central Processing Unit (CPU) 142, a memory 144, and a support circuit 146. The CPU 142 may be any form of a general-purpose computer processor that can be used in an industrial setting. The support circuit 146 is conventionally coupled to the CPU 142 and may comprise a cache, dock circuits, input/output subsystems, power supplies, and the like. Software routines, such as a method as described above may be stored in the memory 144 and, when executed by the CPU 142, transform the CPU 142 into a specific purpose computer (controller 140). The software routines may also be stored and/or executed by a second controller (not shown) that is located remotely.

The memory 144 is in the form of computer-readable storage media that contains instructions, when executed by the CPU 142, to facilitate the operation of the semiconductor processes and equipment. The instructions in the memory 144 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 2:
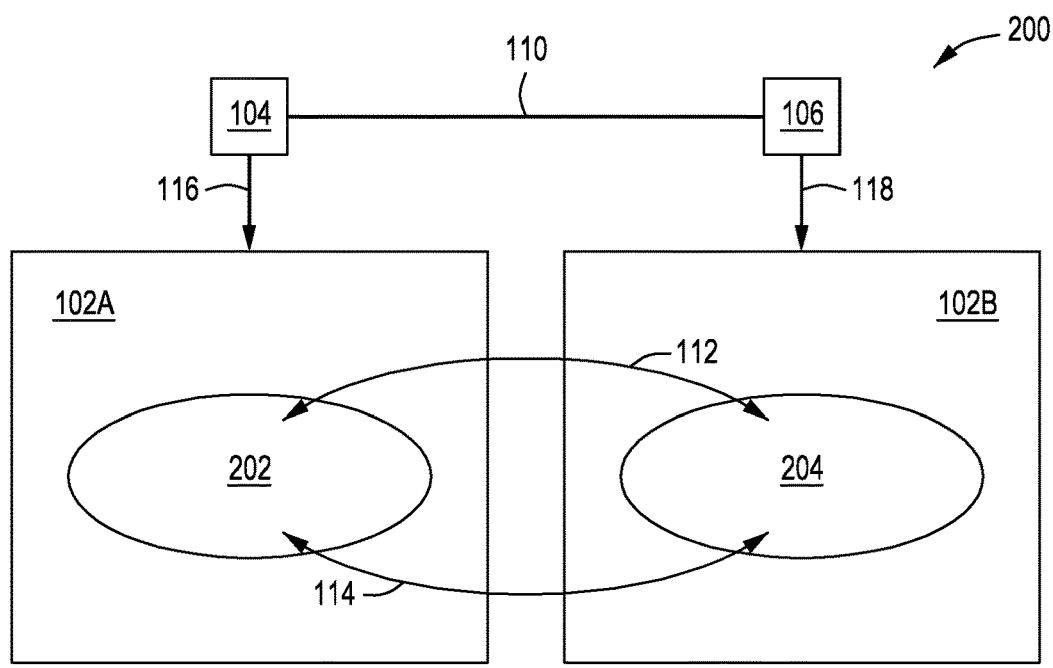
FIG. 2 depicts a schematic view of process chamber interactions in accordance with some embodiments of the present principles.

The inventors have found that the first chamber 102A and the second chamber 102B have inductive coupling 112 and capacitive coupling 114. FIG. 2 depicts a schematic view 200 of process chamber interactions in accordance with some embodiments. When a first plasma 202 is formed in the first chamber 102A and a second plasma 204 is formed in the second chamber 102B, the inventors found that the inductive coupling 112 and the capacitive coupling 114 affected the plasma impedance of the first plasma 202 and the second plasma 204. The inductive coupling 112 and the capacitive coupling 114 caused process defects in the wafer processing of the first chamber 102A and the second chamber 102B such as, but no limited to, nonuniformity of the etch rate and/or the deposition rate and the like. The inventors discovered that the process defects were directly affected by the phase difference between the first RF frequency generator 104 and the second RF frequency generator 106.

Figure 3:
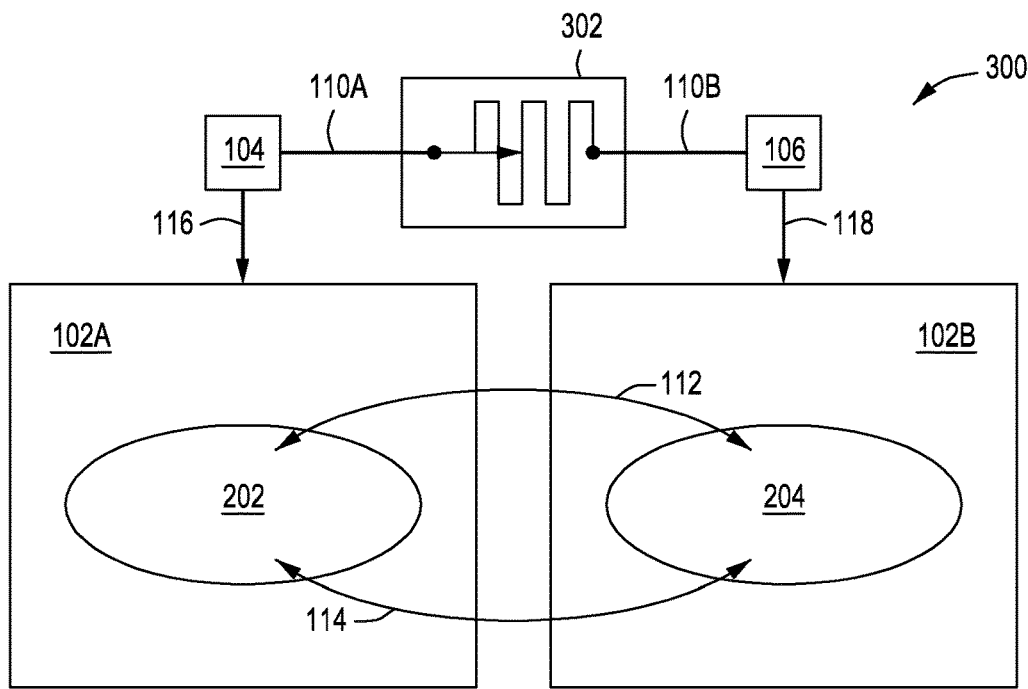
FIG. 3 depicts a schematic view of an adjustable phase shift assembly in accordance with some embodiments of the present principles.

The inventors found that altering the length of the synchronization cable 110 also altered the phase shift between the first RF frequency generator 104 and the second RF frequency generator 106. FIG. 3 depicts a schematic view 300 of an adjustable phase shift assembly 302 in accordance with some embodiments. In some embodiments, the adjustable phase shift assembly 302 is connected to the first RF frequency generator 104 via a first synchronization cable 110A and connected to the second RF frequency generator 106 via a second synchronization cable 110B. As discussed in further detail below, the adjustable phase shift assembly 302 is configured to adjust a total length of the synchronization cable 110 of FIG. 1 (e.g., the length of the first synchronization cable 110A plus the length of the second synchronization cable 110B plus the length provided by the adjustable phase shift assembly 302 between the first RF frequency generator 104 and the second RF frequency generator 106 which directly affects the phase shift between the first RF frequency generator 104 and the second RF frequency generator 106. In some embodiments, the controller 140 may be used to automatically control the adjustable phase shift assembly 302 based on data from one or more metrology sensors 150 and the like.

Figure 4:
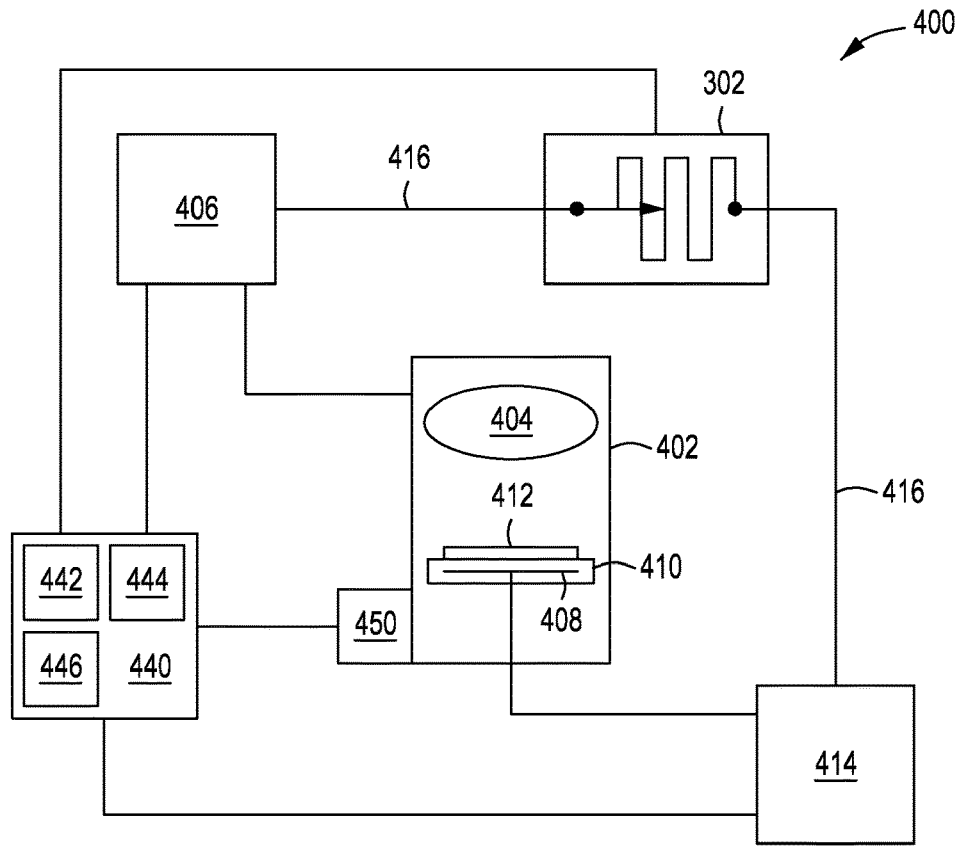
FIG. 4 depicts a schematic view of a single process chamber in accordance with some embodiments of the present principles.

In the semiconductor industry, for some applications, both RF source and RF wafer bias may be used. In such applications, a separate RF source with a different RF frequency than that of the RF wafer bias may be used to avoid the RF interference. By using the methods and apparatus of the present principles, the same RF frequency may be used for both the RF source and the RF wafer bias while optimizing the wafer performance using phase shift control. FIG. 4 depicts a schematic view 400 of a single process chamber 402 in accordance with some embodiments. The single process chamber 402 produces plasma 404 from power provided by an RF plasma power source 406. A bias electrode 408 in a substrate support 410 biases a wafer 412 with bias power from an RF bias power source 414. In some embodiments, the RF plasma power source 406 and the RF bias power source 414 may be synchronized via a synchronization cable 416. A controller 440 controls the operation of the single process chamber 402 using a direct control or alternatively, by controlling the computers (or controllers) associated with the process chamber(s). In operation, the controller 440 enables data collection and feedback from the respective chambers and systems to optimize performance such as from one or more metrology sensors 450. The controller 440 generally includes a Central Processing Unit (CPU) 442, a memory 444, and a support circuit 446. The CPU 442 may be any form of a general-purpose computer processor that can be used in an industrial setting. The support circuit 446 is conventionally coupled to the CPU 442 and may comprise a cache, clock circuits, input/output subsystems, power supplies, and the like. Software routines, such as a method as described above may be stored in the memory 444 and, when executed by the CPU 442, transform the CPU 442 into a specific purpose computer (controller 440). The software routines may also be stored and/or executed by a second controller (not shown) that is located remotely.

The memory 444 is in the form of computer-readable storage media that contains instructions, when executed by the CPU 142, to facilitate the operation of the semiconductor processes and equipment. The instructions in the memory 444 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

In some embodiments, the adjustable phase shift assembly 302 may be interjected into the synchronization cable 416 to allow length adjustments of the synchronization cable to adjust the phase shift between the RF plasma power source 406 and the RF bias power source 414. In traditional systems, the RF plasma power source 406 and the RF bias power source 414 operate at different frequencies due to crosstalk and high reflected power. When using a synchronization cable between the RF plasma power source 406 and the RF bias power source 414, the reflected power should be limited. When the reflected power is limited, the wafer performance may not be optimized (e.g., uniformity, deposition rate, etch rate, etc.). The inventors found that by adjusting the phase shift between the RF plasma power source 406 and the RF bias power source 414 (e.g., adjusting synchronization cable length), the uniformity, deposition rate, and/or etch rate and the like can be optimized, allowing a common frequency to be used with multiple generators in a single chamber. In some embodiments, the phase shift may be adjusted such that the RF plasma power source 406 and the RF bias power source 414 may operate at approximately the same frequency without detrimentally affecting the wafer processing parameters. In some embodiments, the controller 440 may used to automatically adjust the adjustable phase shift assembly 302 based on data from one or more metrology sensors 450 and the like.

Figure 5:
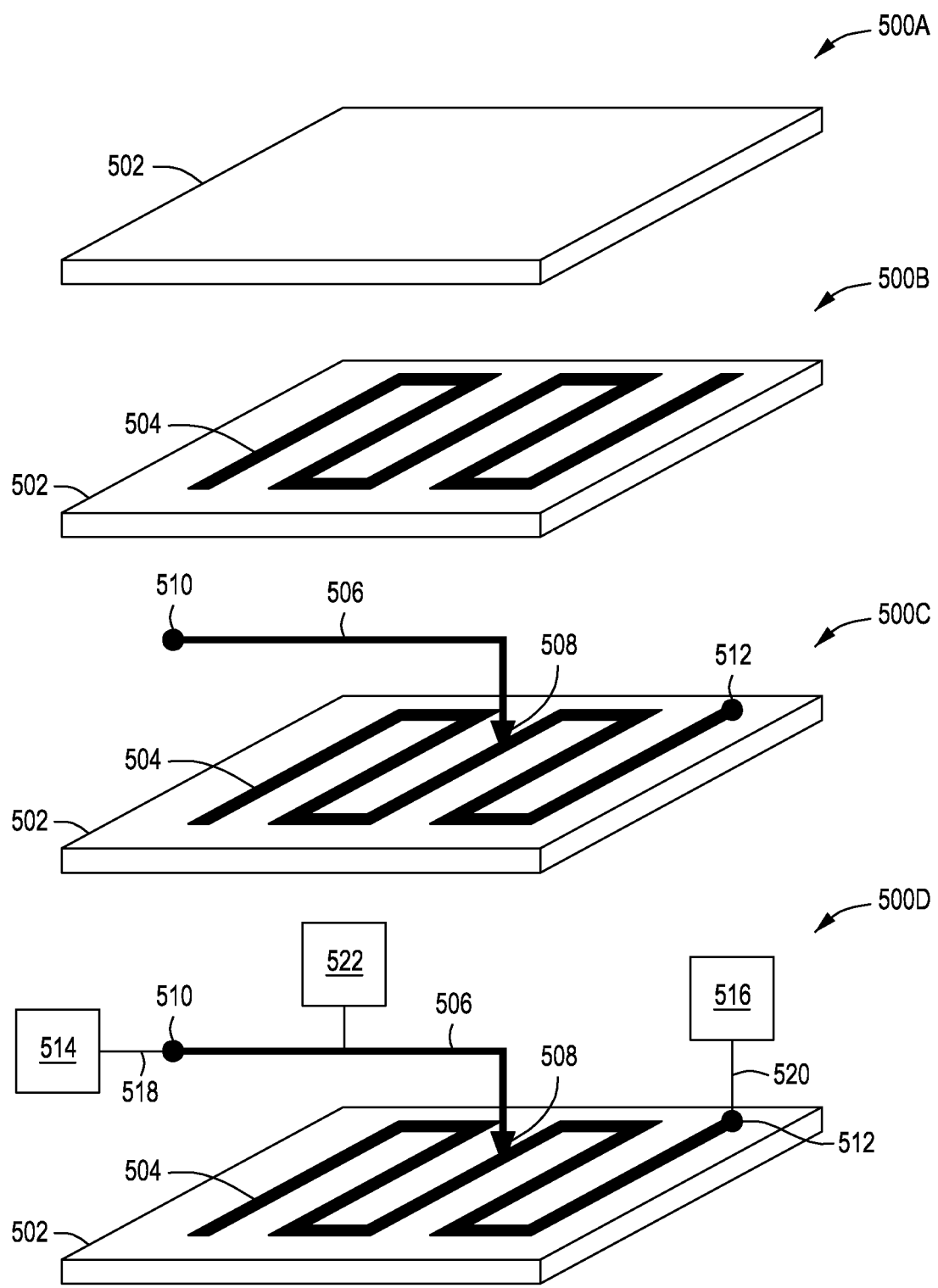
FIG. 5 depicts isometric views of constructing an adjustable phase shift assembly in accordance with some embodiments of the present principles.

FIG. 5 depicts isometric views 500A-D of constructing an adjustable phase shift assembly 302 in accordance with some embodiments. In isometric view 500A, a substrate 502 is used as a base for constructing an adjustable phase shift assembly 302. The substrate 502 may be made of a material that provides a rigid support and at least one surface that is planar and smooth. In some embodiments, the substrate 502 is made from glass, phenolic board, wood, and/or fiberglass material and the like. In isometric view 500B, a two-dimensional trace 504 is formed onto the substrate 502. The two-dimensional trace 504 is conductive and is configured to provide a pathway on which a length of a synchronization cable can be altered. In some embodiments, the two-dimensional trace 504 is formed with conductive ink which may be "printed" on the substrate 502. In some embodiments, the printing may be accomplished with a conductive ink printer, a physical vapor deposition (PVD) process, a chemical vapor deposition (CVD) process, and/or an electrochemical plating (ECP) process, and the like.

In some embodiments, the two-dimensional trace 504 is formed from a conductive material such as, for example, copper and/or graphite and the like. The use of the two-dimensional trace 504 has the additional advantages of minimizing cable capacitive impacts and cable inductive impacts over three-dimensional cables. In some embodiments, the two-dimensional trace 504 may have an overall trace length of greater than zero nanometers to approximately 10 nanometers. In some embodiments, the two-dimensional trace 504 may have an overall trace length of greater than zero millimeters to approximately 10 millimeters. In some embodiments, the two-dimensional trace 504 may have an overall trace length of greater than zero microns to approximately 10 microns. In some embodiments, the two-dimensional trace 504 may have an overall trace length of greater than zero centimeters to approximately 10 centimeters. In some embodiments, the two-dimensional trace 504 may have an overall trace length of greater than zero feet to approximately 20 feet.

In isometric view 500C, an adjustable contact point 508 with a lead 506 and a first connection point 510 is depicted. The two-dimensional trace 504 has a second connection point 512. The first connection point 510 and the second connection point 512 may be connected to a length of synchronization cable or directly connected to RF frequency generators. In some embodiments, the adjustable contact point 508 may freely move along the two-dimensional trace 504 and/or across the two-dimensional trace 504 to lengthen or shorten the length of the trace between the adjustable contact point 508 and the second connection point 512. In isometric view 500D, that adjustable phase shift assembly 302 is connected to a first RF frequency generator 514 and a second RF frequency generator 516. In some embodiments, the first RF frequency generator 514 may be directly connected to the first connection point 510 or connected to the first connection point 510 via a first synchronization cable 518. In some embodiments, the second RF frequency generator 516 may be directly connected to the second connection point 512 or connected to the second connection point 512 via a second synchronization cable 520.

In some embodiments, the adjustable phase shift assembly 302 maybe located within the first RF frequency generator 514, the second RF frequency generator 516, or independent of the first RF frequency generator 514 and the second RF frequency generator 516. In some embodiments, the adjustable contact point 508 may be manually adjusted to a new location along the two-dimensional trace 504 to lengthen or shorten a synchronization cable. In some embodiments, the adjustable contact point 508 may be automatically adjusted to a new location along the two-dimensional trace 504 to lengthen or shorten a synchronization cable by an actuator 522. In some embodiments, the actuator 522 may be programmable to move in a specific fashion along and/or across the two-dimensional trace to lengthen or shorten the trace length between the adjustable contact point and the second connection point 512. In some embodiments, the actuator 522 may be responsive to metrology sensor data and move the adjustable contact point 508 along and/or across the two-dimensional trace 504 accordingly to lengthen or shorten the trace length between the adjustable contact point and the second connection point 512. The lengthening and shortening of the trace length compensates for defects in process chambers by adjusting the phase shift between the first RF frequency generator 514 and the second RF frequency generator 516.

Figure 6:
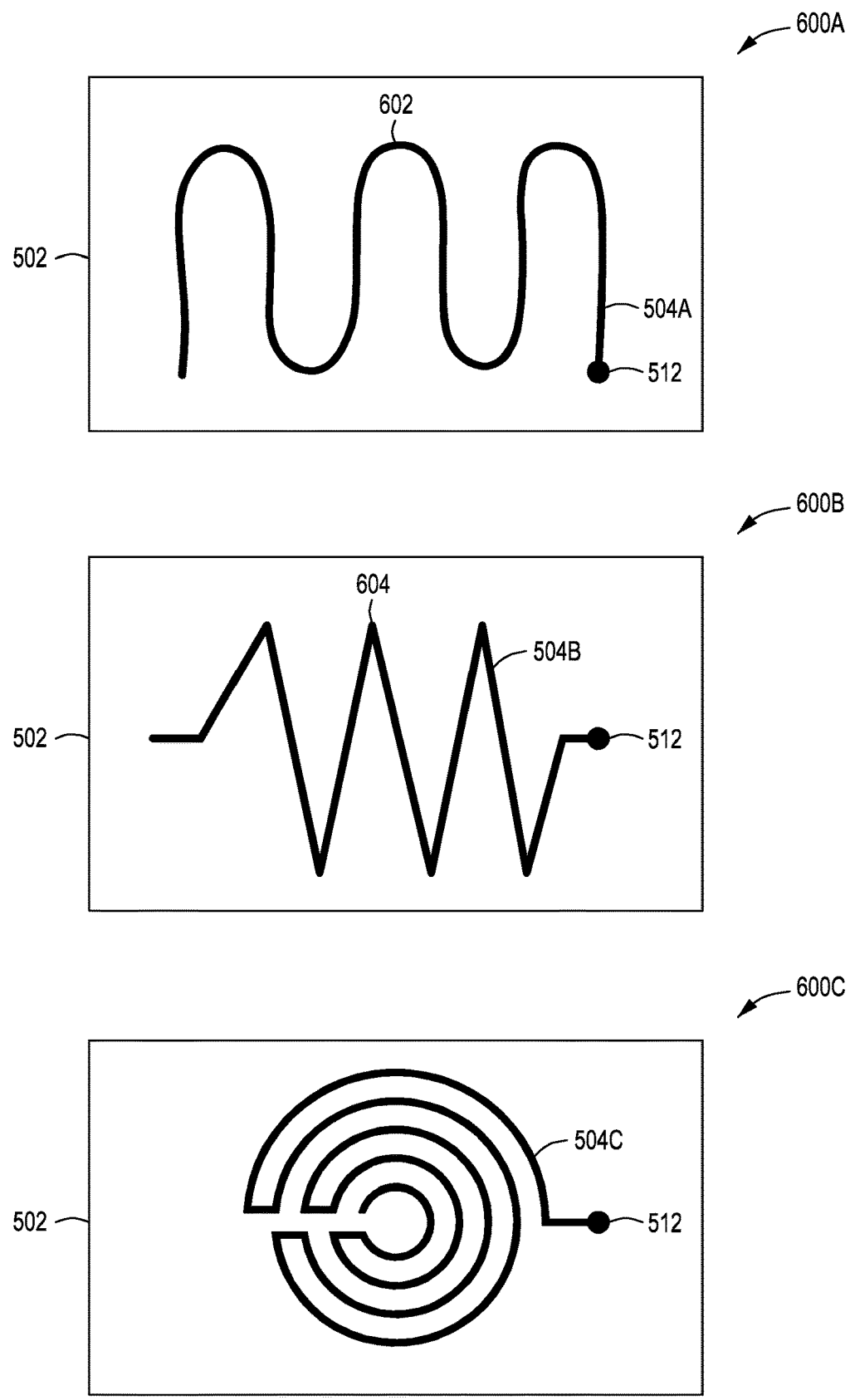
FIG. 6 depicts top-down views of two-dimensional trace patterns in accordance with some embodiments of the present principles.

FIG. 6 depicts top-down views 600A-C of two-dimensional trace patterns in accordance with some embodiments. In a top-down view 600A, the substrate 502 has a two-dimensional trace 504A with a recursive pattern that is rounded in the turns 602. In a top-down view 600B, the substrate 502 has a two-dimensional trace 504B with a recursive pattern that is angular in the turns 604. In a top-down view 600C, the substrate 502 has a two-dimensional trace 504C with a circular pattern that is recursive within the circular pattern. The two-dimensional trace patterns depicted in top-down views 600A-C and also the two-dimensional trace pattern depicted in isometric view 500B of FIG. 5 are examples of two-dimensional trace patterns and are not meant to be limiting in any manner.

Figure 7:
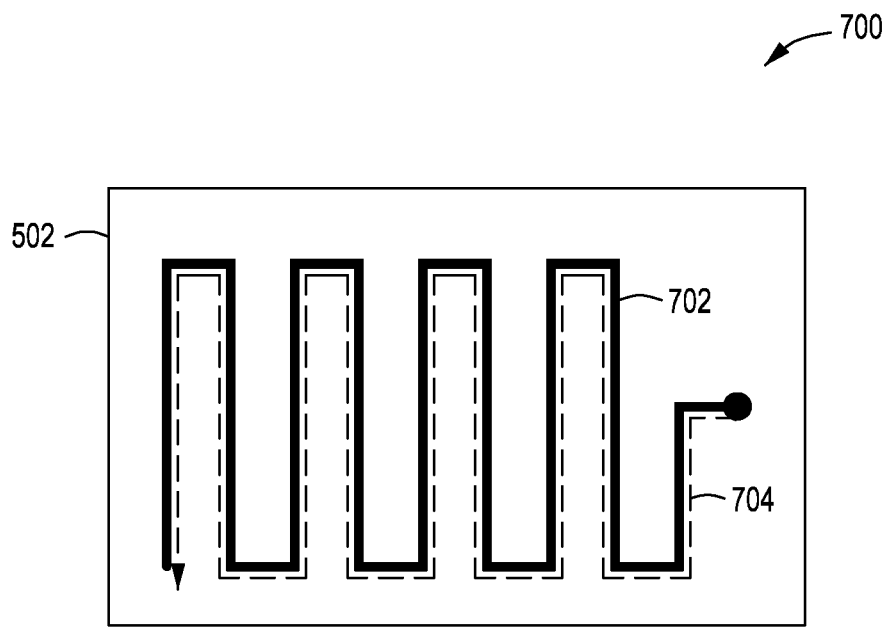
FIG. 7 depicts a top-down view of contact points along a two-dimensional trace in accordance with some embodiments of the present principles.
Figure 8:
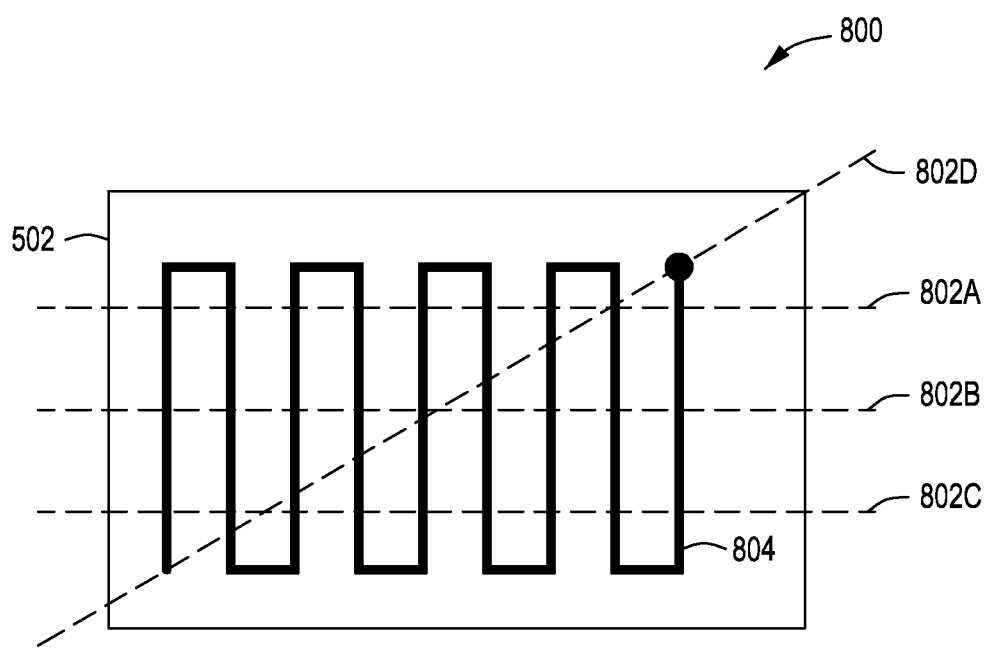
FIG. 8 depicts a top down view of contact point movement lines in accordance with some embodiments of the present principles.

FIG. 7 depicts a top-down view 700 of contact points 704 along a two-dimensional trace 702 in accordance with some embodiments. In some embodiments, the adjustable contact point 508 of FIG. 5 may be moved to any point along the length of the two-dimensional trace 702 to yield an infinite number of length adjustments and associated phase shift changes. FIG. 8 depicts a top down view 800 of contact point movement lines 802A-D in accordance with some embodiments. In some embodiments, the adjustable contact point 508 of FIG. 5 may move across a two-dimensional trace 804 such as, but not limited to, along contact point movement lines 802A-D. Although the contact point movement lines 802A-D are depicted as linear lines, in some embodiments, contact movement lines or paths may not be linear. In some embodiments, process recipes and chamber parameters may be well known such that certain incremental length adjustments may adjust the phase shift to compensate for known issues with wafer processing. The two-dimensional trace and contact movement lines may then be adjusted to provide a more simplistic adjustable phase shift assembly to reduce complexity and costs. In some embodiments with an automated adjustable phase shift assembly, a linear contact movement line for the adjustable contact point is less costly to implement with a linear movement actuator. The two-dimensional trace is significantly less costly to produce and may be changed easily based on a process recipe and/or frequency changes. In some embodiments, the substrate 502 with the two-dimensional trace may be swappable so that the range of adjustment to the length of synchronization cable may be changed easily for different processes and/or different chambers.

Figure 9:
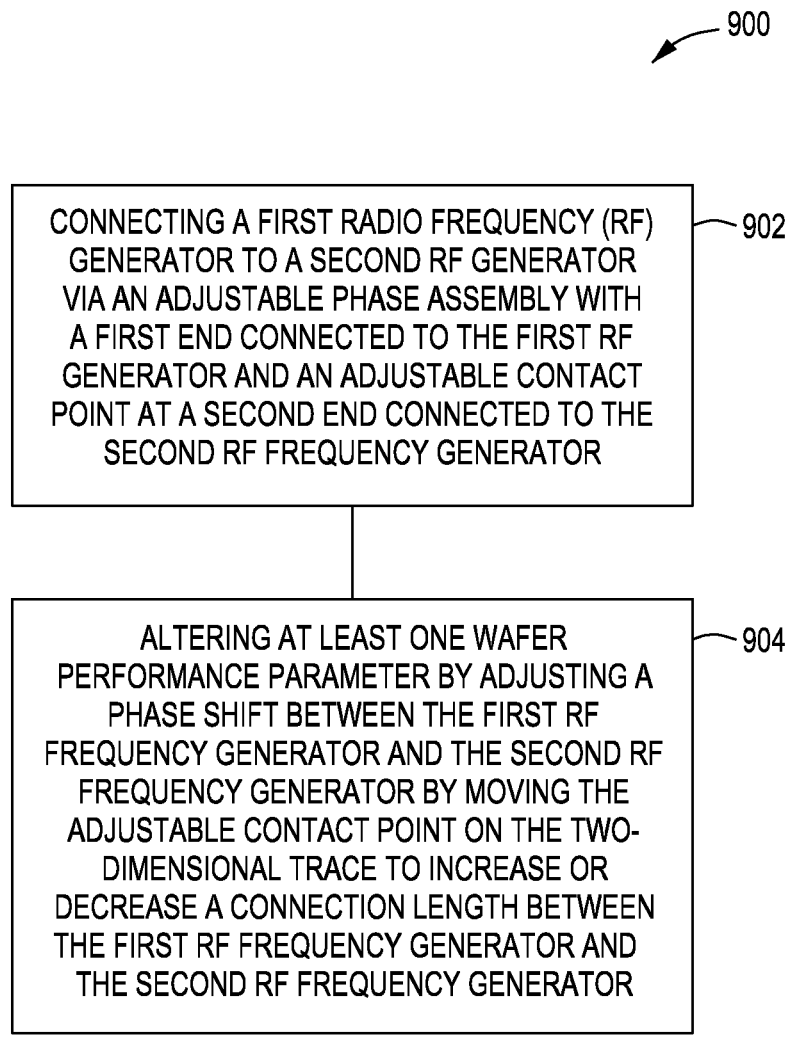
FIG. 9 is a method of adjusting operational parameters with an adjustable phase shift assembly in accordance with some embodiments of the present principles.

FIG. 9 is a method 900 of adjusting operational parameters with an adjustable phase shift assembly in accordance with some embodiments. In block 902, a first RF generator is connected to a second RF generator via an adjustable phase shift assembly with a first end connected to the first RF frequency generator and an adjustable contact point at a second end connected to the second RF frequency generator. In block 904, at least one wafer performance parameter is altered by adjusting a phase shift between the first RF frequency generator and the second RF frequency generator by moving the adjustable contact point on the two-dimensional trace to increase or decrease a connection length between the first RF frequency generator and the second RF frequency generator. The at least one wafer performance parameter may include, but is not limited to, uniformity, etch rate, and/or deposition rate and the like. The amount of phase shift may be based on metrology data from one or more metrology sensors, impedance of the plasma, and/or a given processing recipe including frequency changes and the like. In some embodiments, the phase shift may be adjusted so that a wafer performance parameter of one chamber may be approximately matched to the wafer performance parameter of another chamber. In some embodiments, the phase shift may be adjusted so that a first frequency generator connected to a single chamber may be operated at approximately the same frequency as a second frequency generator connected to the single chamber. In other words, an RF power source of a single chamber may be operated at the same frequency as an RF bias source of the single chamber and the like.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. An apparatus for controlling a semiconductor process, comprising:
an adjustable phase shift assembly with a conductive trace and an adjustable contact point, wherein the adjustable phase shift assembly is configured to be disposed between a first RF frequency generator and a second RF frequency generator using one or more cables, wherein the adjustable phase shift assembly is configured to alter at least one wafer performance parameter by changing a phase shift relationship between the first RF frequency generator and the second RF frequency generator, wherein the conductive trace is a recursive trace with a pattern that moves back and forth without overlapping as a length of the conductive trace progresses, and wherein the adjustable contact point is configured to move across the recursive trace.

2. The apparatus of claim 1, wherein the first RF frequency generator is connected to a first process chamber and the second RF frequency generator is connected to a second process chamber and wherein the adjustable phase shift assembly is configured to approximately match the at least one wafer performance parameter in the first process chamber to the second process chamber.

3. The apparatus of claim 1, wherein the first RF frequency generator supplies RF plasma power in a process chamber and the second RF frequency generator supplies RF bias power in the process chamber and wherein the adjustable phase shift assembly is configured to allow a first frequency of the first RF frequency generator and a second frequency of the second RF frequency generator to be approximately equal.

4. The apparatus of claim 1, wherein the adjustable phase shift assembly is configured to be located within the first RF frequency generator.

5. The apparatus of claim 1, wherein the adjustable phase shift assembly is configured to be connected to the first RF frequency generator and the second RF frequency generator using two or more cables.

6. The apparatus of claim 1, wherein a first end of the conductive trace is configured to be connected within the first RF frequency generator and the adjustable contact point is configured to be connected to one of the one or more cables.

7. The apparatus of claim 1, wherein the adjustable phase shift assembly includes a glass plate with the conductive trace being conductive ink.

8. The apparatus of claim 1, wherein the adjustable phase shift assembly includes a substrate base material with the conductive trace being a copper trace.

9. An apparatus for controlling a semiconductor process, comprising:
a first radio frequency (RF) generator;
a second RF frequency generator;
an adjustable phase shift assembly with a conductive trace and an adjustable contact point, wherein the adjustable phase shift assembly is disposed between the first RF frequency generator and the second RF frequency generator using one or more cables, and wherein the adjustable phase shift assembly is configured to alter at least one wafer performance parameter by changing a phase shift relationship between the first RF frequency generator and the second RF frequency generator, and wherein the apparatus includes at least one of (a), (b), or (c):
(a) at least one metrology sensor configured to receive and transmit metrology data related to a substrate process and a controller connected to the at least one metrology sensor and the adjustable phase shift assembly, the controller configured to receive the metrology data from the at least one metrology sensor and change the phase shift relationship between the first RF frequency generator and the second RF frequency generator in response to the metrology data by automatically changing a length of the cable with the adjustable phase shift assembly;

(b) wherein the conductive trace is a recursive trace with a pattern that moves back and forth without overlapping as a length of the conductive trace progresses and wherein the adjustable contact point is configured to move linearly across the recursive trace; or (c) wherein the adjustable phase shift assembly includes a glass plate with the conductive trace being conductive ink.

10. An apparatus for controlling a semiconductor process, comprising:

an adjustable phase shift assembly with a conductive trace and an adjustable contact point, wherein the adjustable phase shift assembly is configured to disposed between a first RF frequency generator and a second RF frequency generator to alter at least one wafer performance parameter by changing a phase shift between the first RF frequency generator and the second RF frequency generator, and wherein the adjustable phase shift assembly includes a glass plate with the conductive trace formed of conductive ink.

11. The apparatus of claim 10, wherein the first RF frequency generator is connected to a first process chamber and the second RF frequency generator is connected to a second process chamber and wherein the adjustable phase shift assembly is configured to approximately match the at least one wafer performance parameter in the first process chamber to the second process chamber.

12. The apparatus of claim 10, wherein the first RF frequency generator supplies RF plasma power in a process chamber and the second RF frequency generator supplies RF bias power in the process chamber and wherein the adjustable phase shift assembly is configured to allow a first frequency of the first RF frequency generator and a second frequency of the second RF frequency generator to be approximately equal.

13. The apparatus of claim 10, wherein the conductive trace is a recursive trace with a pattern that moves back and forth without overlapping as a length of the conductive trace progresses.

14. The apparatus of claim 10, wherein the conductive trace being a copper trace.

15. An apparatus for controlling a semiconductor process, comprising:

a first radio frequency (RF) generator;

a second RF frequency generator;

an adjustable phase shift assembly with a conductive trace with a first end connected to the first RF frequency generator and an adjustable contact point connected to the second RF frequency generator, the adjustable phase shift assembly configured to alter at least one wafer performance parameter by changing a phase shift between the first RF frequency generator and the second RF frequency generator by moving the adjustable contact point on the conductive trace, and wherein the apparatus includes at least one of (a) or (b):

(a) at least one metrology sensor configured to receive and transmit metrology data related to a substrate process and a controller connected to the at least one metrology sensor and the adjustable phase shift assembly, the controller configured to receive the metrology data from the at least one metrology sensor and change the phase shift between the first RF frequency generator and the second RF frequency generator in response to the metrology data by automatically moving the adjustable contact point on the conductive trace; or (b) wherein the adjustable phase shift assembly includes a glass plate with the conductive trace being conductive ink.

16. A method of controlling a semiconductor process, comprising:

connecting a first radio frequency (RF) generator to a second RF frequency generator via an adjustable phase shift assembly having a conductive trace with a first end connected to the first RF frequency generator and an adjustable contact point connected to the second RF frequency generator, wherein the conductive trace is a recursive trace with a pattern that moves back and forth without overlapping as a length of the conductive trace progresses, and wherein the adjustable contact point moves across the recursive trace; and altering at least one wafer performance parameter by adjusting a phase shift between the first RF frequency generator and the second RF frequency generator by moving the adjustable contact point on the conductive trace to increase or decrease a connection length between the first RF frequency generator and the second RF frequency generator.

17. The method of claim 16, further comprising:

receiving metrology data from at least one sensor related to a substrate process; and adjusting the phase shift between the first RF frequency generator and the second RF frequency generator by automatically moving the adjustable contact point on the conductive trace, the phase shift adjusted to improve the metrology data.

* * * * *